United States Patent
Obkircher et al.

(10) Patent No.: US 12,489,411 B2
(45) Date of Patent: Dec. 2, 2025

(54) HOT SWITCHING SPUR SUPPRESSION

(71) Applicant: Skyworks Solutions, Inc., Irvine, CA (US)

(72) Inventors: Thomas Obkircher, Santa Ana, CA (US); Nuttapong Srirattana, Lexington, MA (US); Zijiang Yang, Lexington, MA (US); Yi Yang, Malden, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 319 days.

(21) Appl. No.: 18/223,976

(22) Filed: Jul. 19, 2023

(65) Prior Publication Data
US 2024/0030909 A1    Jan. 25, 2024

Related U.S. Application Data

(60) Provisional application No. 63/390,915, filed on Jul. 20, 2022.

(51) Int. Cl.
| | |
|---|---|
| *H03F 3/72* | (2006.01) |
| *H03F 3/195* | (2006.01) |
| *H03F 3/24* | (2006.01) |
| *H03K 17/693* | (2006.01) |

(52) U.S. Cl.
CPC ............. *H03F 3/72* (2013.01); *H03F 3/195* (2013.01); *H03F 3/245* (2013.01); *H03K 17/693* (2013.01); *H03F 2200/294* (2013.01); *H03F 2200/451* (2013.01)

(58) Field of Classification Search
CPC . H03F 3/72; H03F 3/195; H03F 3/245; H03F 2200/451; H03K 17/693
See application file for complete search history.

(56) References Cited

U.S. PATENT DOCUMENTS

| | | |
|---|---|---|
| 5,959,516 A | 9/1999 | Chang et al. |
| 6,397,077 B1 | 5/2002 | Jensen |
| 6,496,061 B1 | 12/2002 | Bloom et al. |
| 6,515,541 B2 | 2/2003 | Cheng et al. |
| 6,759,922 B2 | 7/2004 | Adar et al. |
| 6,765,439 B2 | 7/2004 | Chi |
| 6,894,476 B2 | 5/2005 | Wyse et al. |
| 7,795,966 B2 | 9/2010 | Wyse |
| 8,049,558 B2 | 11/2011 | Wyse |
| 8,330,552 B2 | 12/2012 | Li et al. |
| 8,417,196 B2 | 4/2013 | Kitching et al. |
| 8,514,016 B2 | 8/2013 | Ripley et al. |
| 8,514,118 B2 | 8/2013 | Eldredge |
| 8,928,426 B2 | 1/2015 | Li et al. |
| 8,928,428 B2 | 1/2015 | Gorbachov |
| 8,941,449 B2 | 1/2015 | Li et al. |
| 8,989,332 B2 | 3/2015 | Katumba et al. |
| 8,994,420 B2 | 3/2015 | Eldredge et al. |

(Continued)

*Primary Examiner* — Patrick O Neill
(74) *Attorney, Agent, or Firm* — Knobbe, Martens, Olson & Bear, LLP

(57) ABSTRACT

A radio-frequency module has radio-frequency input and outputs and a radio-frequency core connected between them and configured to transition between operational states. An energy management core triggers a selected transition between two of the operational states via a sequence of transitions between the plurality of operational states.

20 Claims, 9 Drawing Sheets

(56) References Cited

U.S. PATENT DOCUMENTS

| | | |
|---|---|---|
| 9,007,142 B1 | 4/2015 | Ozard |
| 9,014,647 B2 | 4/2015 | Kitching et al. |
| 9,065,385 B2 | 6/2015 | Gorbachov |
| 9,083,455 B2 | 7/2015 | Popplewell et al. |
| 9,093,734 B2 | 7/2015 | Gorbachov |
| 9,214,967 B2 | 12/2015 | Reisner et al. |
| 9,356,330 B1 | 5/2016 | Donoghue et al. |
| 9,391,648 B2 | 7/2016 | Popplewell et al. |
| 9,406,741 B2 | 8/2016 | Zampardi, Jr. et al. |
| 9,425,833 B2 | 8/2016 | Popplewell et al. |
| 9,496,902 B2 | 11/2016 | Srirattana et al. |
| 9,531,392 B2 | 12/2016 | Katumba et al. |
| 9,553,617 B2 | 1/2017 | Srirattana et al. |
| 9,602,060 B2 | 3/2017 | Gorbachov et al. |
| 9,614,269 B2 | 4/2017 | Srirattana et al. |
| 9,692,103 B2 | 6/2017 | Srirattana et al. |
| 9,722,771 B2 | 8/2017 | Banowetz et al. |
| 9,748,627 B2 | 8/2017 | Sun et al. |
| 9,755,670 B2 | 9/2017 | Chen et al. |
| 9,762,250 B2 | 9/2017 | Perrott |
| 9,768,790 B2 | 9/2017 | Namdar-mehdiabadi et al. |
| 9,793,592 B2 | 10/2017 | Srirattana et al. |
| 9,806,395 B2 | 10/2017 | Li et al. |
| 9,812,757 B2 | 11/2017 | Srirattana et al. |
| 9,866,244 B2 | 1/2018 | Srirattana et al. |
| 9,866,335 B2 | 1/2018 | Hernandez |
| 9,905,902 B2 | 2/2018 | Zhang et al. |
| 9,941,856 B2 | 4/2018 | Srirattana et al. |
| 9,948,271 B2 | 4/2018 | Srirattana et al. |
| 9,953,938 B2 | 4/2018 | Srirattana et al. |
| 9,954,430 B2 | 4/2018 | Horváth et al. |
| 9,954,562 B2 | 4/2018 | Reisner et al. |
| 9,954,564 B2 | 4/2018 | Little et al. |
| 9,960,747 B2 | 5/2018 | Whitefield et al. |
| 9,960,750 B2 | 5/2018 | Srirattana et al. |
| 9,960,793 B2 | 5/2018 | Anthony et al. |
| 10,084,224 B2 | 9/2018 | Srirattana et al. |
| 10,128,558 B2 | 11/2018 | Sun et al. |
| 10,249,930 B2 | 4/2019 | Srirattana et al. |
| 10,256,523 B2 | 4/2019 | Li et al. |
| 10,284,167 B2 | 5/2019 | Srirattana et al. |
| 10,497,495 B2 | 12/2019 | Zampardi, Jr. et al. |
| 10,505,501 B2 | 12/2019 | Gorbachov et al. |
| 10,511,315 B1 | 12/2019 | Sarda |
| 10,523,211 B2 | 12/2019 | Drost |
| 10,659,060 B2 | 5/2020 | Monk et al. |
| 10,680,622 B2 | 6/2020 | Monk et al. |
| 10,742,189 B2 | 8/2020 | Srirattana et al. |
| 10,742,241 B2 | 8/2020 | Cook et al. |
| 10,756,048 B2 | 8/2020 | Flores et al. |
| 10,763,568 B2 | 9/2020 | Srirattana et al. |
| 10,819,353 B1 | 10/2020 | Monk et al. |
| 11,095,295 B2 | 8/2021 | Monk et al. |
| 11,190,182 B2 | 11/2021 | Balteanu et al. |
| 11,445,445 B2 | 9/2022 | Ripley |
| 11,451,248 B2 | 9/2022 | Cook et al. |
| 11,621,682 B2 | 4/2023 | Arfaei Malekzadeh et al. |
| 11,664,829 B2 | 5/2023 | Jayaraman et al. |
| 11,664,833 B2 | 5/2023 | Lam |
| 11,689,163 B2 | 6/2023 | Samelis |
| 11,689,202 B2 | 6/2023 | Balteanu et al. |
| 2012/0019335 A1 | 1/2012 | Hoang et al. |
| 2015/0349742 A1 | 12/2015 | Chen et al. |
| 2016/0191085 A1 | 6/2016 | Kasnavi et al. |
| 2017/0093442 A1 | 3/2017 | Jayaraman et al. |
| 2018/0260358 A1* | 9/2018 | Obkircher ........... G06F 13/4291 |
| 2019/0367356 A1* | 12/2019 | Khlat ................ H03F 1/56 |
| 2022/0103192 A1 | 3/2022 | Pehlke |
| 2022/0103193 A1 | 3/2022 | Pehlke |
| 2022/0271409 A1 | 8/2022 | Yang et al. |
| 2022/0311118 A1 | 9/2022 | Jayaraman et al. |
| 2022/0359970 A1 | 11/2022 | Srinivasan et al. |
| 2022/0359971 A1 | 11/2022 | Srinivasan et al. |
| 2022/0393326 A1 | 12/2022 | Srirattana et al. |
| 2023/0079623 A1 | 3/2023 | Gebeyehu |
| 2023/0080564 A1 | 3/2023 | Pehlke et al. |
| 2023/0091247 A1 | 3/2023 | Naraine et al. |
| 2023/0094645 A1 | 3/2023 | Jayakumar |

\* cited by examiner

HOT SWITCHING SPUR SUPPRESSION

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of this disclosure relate to radio frequency (RF) electronic systems, such as front end systems and related devices, integrated circuits, modules, and methods.

Description of the Related Technology

A RF electronic system can process radio frequency signals in a frequency range from about 30 kilohertz (kHz) to 300 Gigahertz (GHz), such as in a range from about 450 Megahertz (MHz) to 6 GHz. A front end system is an example of a radio frequency electronic system. A front end system can be referred to as a radio frequency front end system. A front end system can process signals being transmitted and/or received via one or more antennas. For example, a front end system can include one or more switches and/or antenna or coupler switch modules, one or more filters, one or more low noise amplifiers, one or more power amplifiers, other circuitry, or any suitable combination thereof in one or more signal paths between one or more antennas and a transceiver. Front end systems can include one or more receive paths and one or more transmit paths.

SUMMARY

In some aspects, the techniques described herein relate to a radio-frequency module including: a radio-frequency input port; a radio-frequency output port; a radio-frequency core connected between the radio-frequency input port and the radio-frequency output port and configured to transition between a plurality of operational states; and an energy management core configured to trigger a selected transition between two operational states of the plurality of operational states via a sequence of transitions between the plurality of operational states.

In some aspects, the techniques described herein relate to a radio-frequency module wherein the transition between the plurality of operational states includes an initial operational state and a final operational state.

In some aspects, the techniques described herein relate to a radio-frequency module wherein the sequence of transitions includes the initial operational state, one or more intermediate states, and the final operational state.

In some aspects, the techniques described herein relate to a radio-frequency module wherein the initial operational state, the one or more intermediate states, and the final operational state include initial states and final states of a plurality of switches.

In some aspects, the techniques described herein relate to a radio-frequency module wherein a state of at least one switch of the plurality of switches remains unchanged upon transitioning via the sequence of transitions between the plurality of operational states.

In some aspects, the techniques described herein relate to a radio-frequency module wherein the one or more intermediate states consist of one, two, or three states.

In some aspects, the techniques described herein relate to a radio-frequency module wherein the energy management core includes a decoder configured to delay a trigger to sequence the transition between two selected operational states.

In some aspects, the techniques described herein relate to a radio-frequency module wherein the energy management core includes a transition detector configured to observe transitions between operational states of the plurality of operational states In some aspects, the techniques described herein relate to a radio-frequency module wherein the transition detector is further configured to select the transition between two operational states from the observed transitions if the observed transition matches with any of the ones specified to require one or more intermediate states.

In some aspects, the techniques described herein relate to a radio-frequency module wherein the transition detector is further configured to define a transition index for generating the one or more intermediate states.

In some aspects, the techniques described herein relate to a radio-frequency module wherein the energy management core includes a dynamic look-up table configured to generate one or more intermediate states.

In some aspects, the techniques described herein relate to a radio-frequency module wherein the energy management core includes a transition multiplexor configured to pass an output of a dynamic look-up table to an output of the decoder output during a transition period.

In some aspects, the techniques described herein relate to a radio-frequency module wherein the energy management core includes a transition multiplexor configured to pass an output of a static look-up table to an output of the decoder output before and/or after a transition period.

In some aspects, the techniques described herein relate to a radio-frequency module wherein the energy management core includes a transition multiplexor configured to pass an output of a static look-up table to an output of the decoder output before and/or after a transition period.

In some aspects, the techniques described herein relate to a method of transitioning between operational states of a radio-frequency module including: receiving a trigger to transition from an initial operational state to a final operational state; sequencing the transition into a sequence of transitions between the initial operational state and the final operational state; and transitioning from the initial operational state to the final operational state via the sequence of transitions.

In some aspects, the techniques described herein relate to a method wherein the sequence of transitions includes the initial operational state, one or more intermediate states, and the final operational state.

In some aspects, the techniques described herein relate to a method wherein the initial operational state, the one or more intermediate states, and the final operational state include initial states and final states of a plurality of switches.

In some aspects, the techniques described herein relate to a method wherein a state of at least one switch of the plurality of switches remains unchanged upon transitioning via the sequence of transitions between the plurality of operational states.

In some aspects, the techniques described herein relate to a method wherein the one or more intermediate states consist of one, two, or three states.

In some aspects, the techniques described herein relate to a mobile device including: an radio-frequency input port; an radio-frequency output port; an radio-frequency core connected between the radio-frequency input port and the radio-frequency output port and configured to transition between a plurality of operational states; and an energy management core configured to trigger a selected transition between two operational states of the plurality of operational states via a sequence of transitions between the plurality of operational states.

In some aspects, the techniques described herein relate to a mobile device wherein the transition between the plurality of operational states includes an initial operational state and a final operational state.

In some aspects, the techniques described herein relate to a mobile device wherein the sequence of transitions includes the initial operational state, one or more intermediate states, and the final operational state.

In some aspects, the techniques described herein relate to a mobile device wherein the initial operational state, the one or more intermediate states, and the final operational state include initial states and final states of a plurality of switches.

In some aspects, the techniques described herein relate to a mobile device wherein a state of at least one switch of the plurality of switches remains unchanged upon transitioning via the sequence of transitions between the plurality of operational states.

In some aspects, the techniques described herein relate to a mobile device wherein the one or more intermediate states consist of one, two, or three states.

In some aspects, the techniques described herein relate to a mobile device wherein the energy management core includes a decoder configured to delay a trigger to sequence the transition between two selected operational states.

In some aspects, the techniques described herein relate to a mobile device wherein the energy management core includes a transition detector configured to observe transitions between operational states of the plurality of operational states In some aspects, the techniques described herein relate to a mobile device wherein the transition detector is further configured to select the transition between two operational states from the observed transitions if the observed transition matches with any of the ones specified to require one or more intermediate states.

In some aspects, the techniques described herein relate to a mobile device wherein the transition detector is further configured to define a transition index for generating the one or more intermediate states.

In some aspects, the techniques described herein relate to a mobile device wherein the energy management core includes a dynamic look-up table configured to generate one or more intermediate states.

In some aspects, the techniques described herein relate to a mobile device wherein the energy management core includes a transition multiplexor configured to pass an output of a dynamic look-up table to an output of the decoder output during a transition period.

In some aspects, the techniques described herein relate to a mobile device wherein the energy management core includes a transition multiplexor configured to pass an output of a static look-up table to an output of the decoder output before and/or after a transition period.

In some aspects, the techniques described herein relate to a mobile device wherein the energy management core includes a transition multiplexor configured to pass an output of a static look-up table to an output of the decoder output before and/or after a transition period.

In some aspects, the techniques described herein relate to a mobile device wherein the radio-frequency input port, the radio-frequency output port, the radio-frequency core and the energy management core are integrated in an radio-frequency frontend system of the mobile device.

BRIEF DESCRIPTION OF THE DRAWINGS

Embodiments of this disclosure will now be described, by way of non-limiting example, with reference to the accompanying drawings.

DETAILED DESCRIPTION OF EMBODIMENTS

Figure 1:
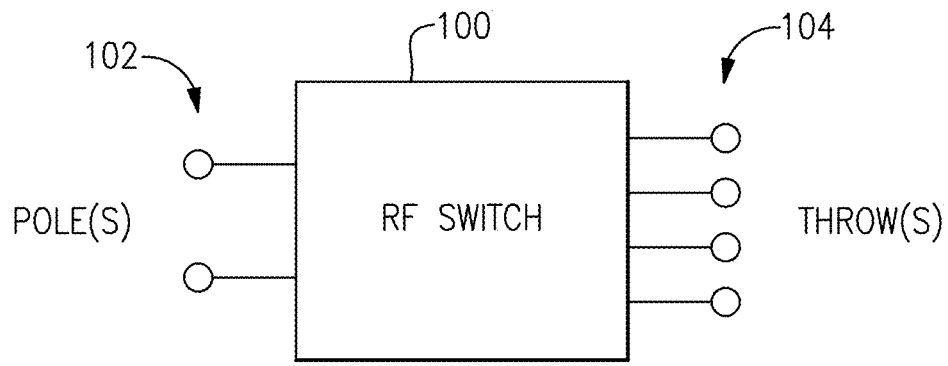
FIG. 1 is a block diagram illustrating an exemplary RF switch.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The RF core of a coupler switch module, such as an antenna switch module, typically comprises two RF input pins, which are classically fanned out to internal band-pass filter, low-pass filter or bypass paths to be afterwards recombined and passed through an attenuator stage to a module output pin. All the numerous input, output and attenuator series and shunt switches within the coupler RF core are generated with positive and negative voltage levels within an energy management (EM) core. The logic levels of all these control signals are defined by a decoder table, based on state-defined register settings.

If a RF signal is present at the input ports and the desired state is dynamically altered from one condition to another, also called as "hot switching", a transient spur shows up at the RF output, as the spectral impulse response of the control signals get modulated onto the RF signal. These spurious tones not only occur during transition from one RF input to another, but also during turn-on and turn-off transitions.

One approach to overcome this problem is to slow down a slew rate of the control signals with a RC filter and therefore reduce frequency response of the switch impulse response. However, this solution will increase the area significantly, as delays need to be added on each control signal and will also affect the response of transitions which are immune to hot-switching. In addition, the slew rate will also vary over process, voltage, and temperature (PVT) and can therefore still show spurs at corner cases and could also impact stringent switching time requirements.

The present disclosure proposes a fully-integrated, dynamic approach which automatically inserts intermediate states within the decoder for required crucial state transitions.

FIG. 1 schematically shows a RF switch 100 configured to switch one or more signals between one or more poles 102 and one or more throws 104. In some embodiments, such a switch can be based on one or more field-effect transistors (FETs). When a particular pole is connected to a particular throw, such a path is commonly referred to as being closed or in an ON state. When a given path between a pole and a throw is not connected, such a path is commonly referred to as being open or in an OFF state.

Figure 2:
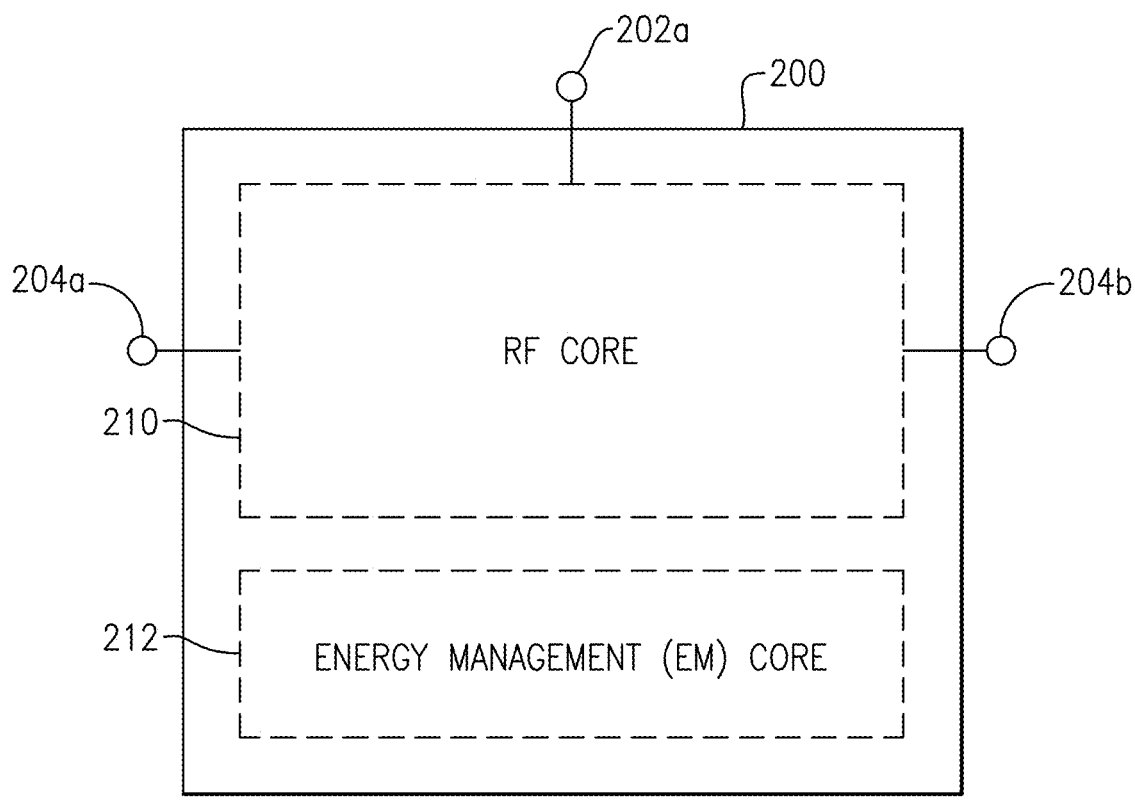
FIG. 2 is a block diagram illustrating a RF switch including an exemplary RF core and an exemplary energy management, EM, core.

FIG. 2 shows that in some implementations, the RF switch 200 can include an RF core 210 and an energy management (EM) core 212. The RF core 210 can be configured to route RF signals between the first and second ports. In the example single-pole-double-throw (SPDT or SP2T) configuration shown in FIG. 2, such first and second ports can include a pole 102 and a first throw 104 (left), or the pole 102 and a second throw 104 (right).

In some embodiments, EM core 212 can be configured to supply, for example, voltage control signals to the RF core. The EM core 212 can be further configured to provide the RF switch 200 with logic decoding and/or power supply conditioning capabilities.

In some embodiments, the RF core 210 can include one or more poles and one or more throws to enable passage of RF signals between one or more inputs and one or more outputs of the switch 200. For example, the RF core 210 can include a SP2T configuration as shown in FIG. 2.

Figure 3:
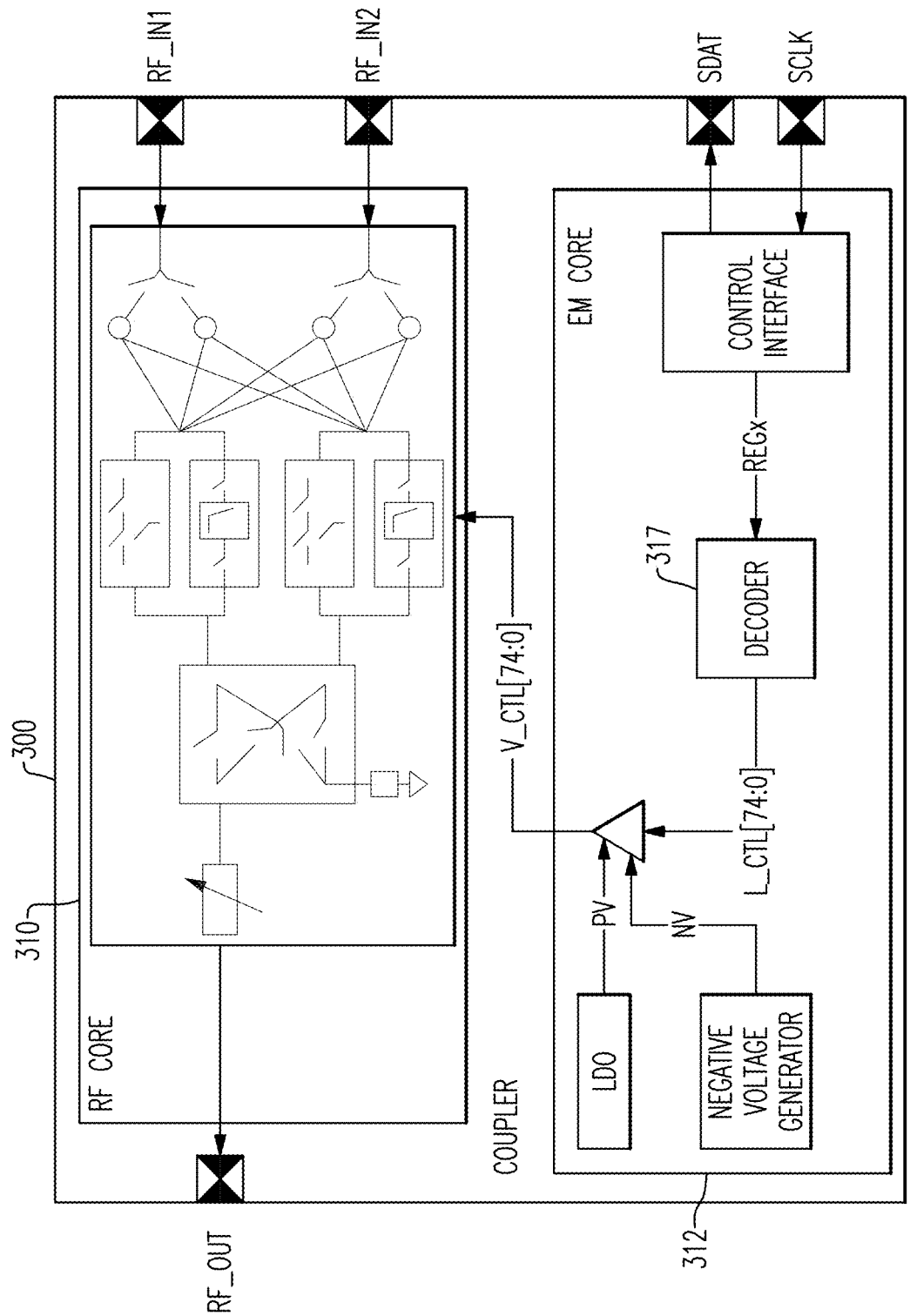
FIG. 3 is a block diagram of aspects of an exemplary antenna switch module.

FIG. 3 is a block diagram of a coupler such as an antenna switch module (ASM) 300 showing aspects of one or more embodiments disclosed herein. The ASM 300 may be a multi-band antenna switch module. The ASM 300 includes a RF core 310 and an EM core 312. The RF core 310 may be connected to one or more RF input pins, such as RF_IN1 and RF_IN2, which are classically fanned out to internal band-pass filter, low-pass filter or bypass paths to be afterwards recombined and, e.g., passed through an attenuator stage to one or more RF output pins, such as RF OUT.

The one or more RF input pins may be coupled to one or more internal signal paths, which may have associated therewith various low-noise amplifiers (LNA) and/or filters, as well as an output switch configured to at least partially combine the internal signal paths to a single output RF port.

The numerous input, output and attenuator series and shunt switches within the coupler RF core 310 are generated with positive and negative voltage levels within the EM 312 core. The logic levels of all these control signals are defined by a decoder table, based on state-defined register settings.

In certain embodiments, input switch selection, output switch selection and/or amplifier configuration signals may be controlled at least in part by the EM core 312. The EM core 312 may be configured to receive commands using a software-controlled interface register-map, wherein the commands may be decoded based at least in part on a look-up table comprising values corresponding to, for example, all possible states of the switches. The decoder 317 of the EM core 312 may provide a substantially static combinatorial circuit for control signal generation.

As referenced above, the decoder 317 of the EM core 312 may be configured to decode certain signal settings and control the various switches of the RF core 310, along with possibly other devices or configurations. The decoder 317 may implement a substantially static decoder truth table. Such a table may define a current state of the RF core 310 using one or more register bits as input, wherein the decoder 317 may translate the input register bits into the logical control signal (L_CTL). The EM core 312 may further include a negative voltage generator (NVG) configured to provide a negative voltage signal (NV) for generating the negative voltage levels for the voltage control signal (V_CTL).

The EM core 312 may further include a low-dropout regulator (LDO), which may be configured to condition the power supply (e.g., battery supply) into positive voltage for providing the positive control voltage. The control signal (V_CTL) may be of any type of control signal, having any number of bits or configuration. In certain embodiments, the control signal (V_CTL) is implemented using a parallel control bus, wherein a high signal (e.g., approximately 2.4 V) holds a switch in an ON state, whereas a low signal (e.g., approximately −2.4 V) holds a switch in an OFF state. With respect to parallel control busses, references herein to "control signal," "signal," or the like may refer to the parallel lines or signals collectively or individually.

Figure 4:
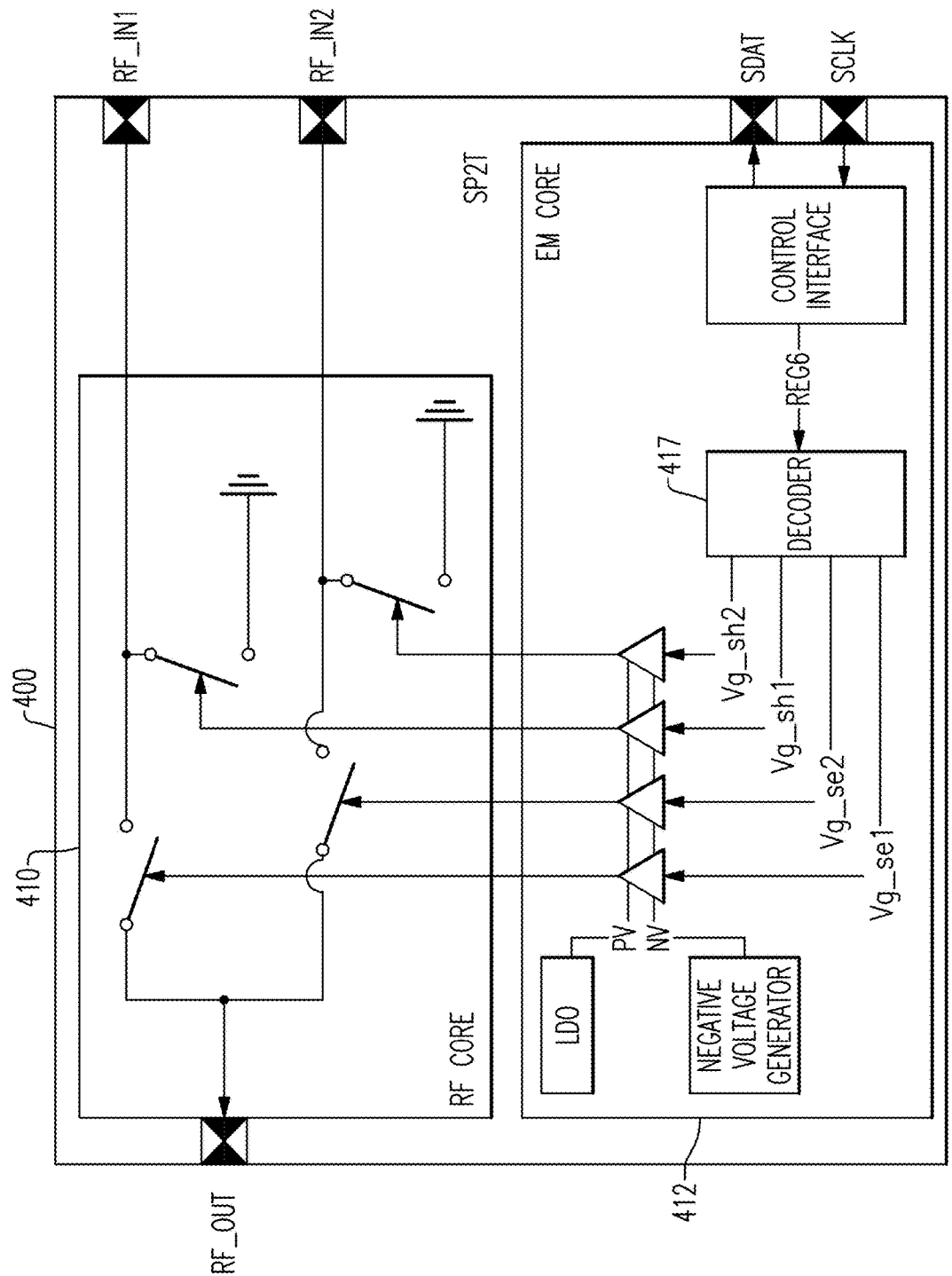
FIG. 4 is a block diagram of aspects of an exemplary antenna switch module.

FIG. 4 is a block diagram of SPDT or SP2T switch of an ASM 400 showing aspects of one or more embodiments disclosed herein. The ASM 400 may be similar in certain respects to the ASM 300 of FIG. 3. The ASM 400 includes an EM core 412 comprising an enhanced decoder 417. The decoder 417 may be configured to utilize one or more clock signals (identified for convenience as "SCLK").

The clock signal, SCLK, may be an external interface clock signal, wherein certain control registers may be updated based on the first clock signal. The clock signal SCLK may be used at least in part for state transition detection.

The decoder 417 may include a transition look-up table module 519 (see FIG. 5), which may be used to maintain one or more tables defining states, which may be based at least in part on a crucial configuration of one or more registers (e.g., Reg6[3:0]). As an example implementation Table A below provides example data that may at least in part be associated with such a table.

TABLE A

| | | Static | | | |
|---|---|---|---|---|---|
| State | Reg6[3:0] | Vg_se1 | Vg_se2 | Vg_sh1 | Vg_sh2 |
| 0 | 3 | 2.4 | −2.4 | −2.4 | 2.4 |
| 1 | 4 | −2.4 | 2.4 | 2.4 | −2.4 |

A high signal (e.g., approximately 2.4 V) holds a switch in an ON state, whereas a low signal (e.g., approximately −2.4 V) holds a switch in an OFF state.

The decoders 317 and 417 shown in FIGS. 3 and 4, may, by means of a main combinatorial look-up table, map a set of register values, defining band selection and/or other modes, to a series of RF core control signals. The decoders 317 and 417 shown in FIGS. 3 and 4 may be enhanced as detailed in decoder 517 of FIG. 5.

Figure 5:
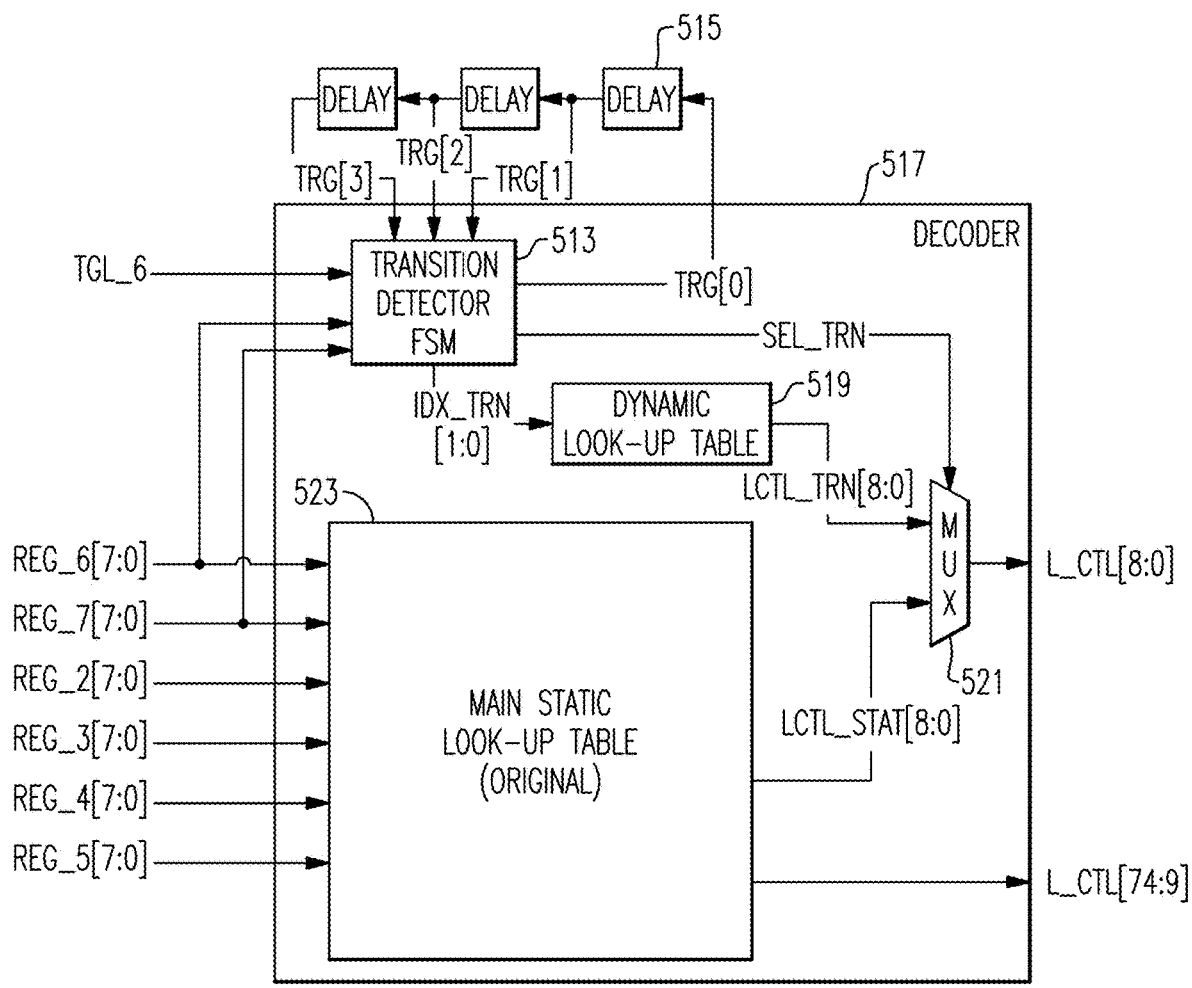
FIG. 5 is a block diagram of an enhanced decoder according to an embodiment of the present invention.

FIG. 5 provides an example corresponding to one or more embodiments showing how dynamic decoding according to the present disclosure may be implemented using a decoder 517. The decoder 517 includes a main look-up table 523, which may be a substantially static table configured to provide control signal logic. In certain embodiments, at least a portion of the output of the main look-up table 523 may be multiplexed with output from a dynamic look-up table when the multiplexer 521 is set to a certain state.

The transition detector 513 wakes up in static mode. The transition detector finite state machine (FSM) gets activated when a toggle signal TGL_6 and REG_6/7 received by the decoder 517 matches a valid state transition, which requires a dynamic sequence. The multiplexer 521 switches to dynamic mode for L_CTL[8:0]. The trigger signal TRG[0] generates delayed versions TRG[1], TRG[2], TRG[3] to sequence the FSM through the different states. Based on state machine index IDX_TRN, the dynamic look-up table 519 defines logic control for each transition sequence. The FSM times out after receiving TRG[3] and goes back to sleep and switches to static mode.

Figure 6:
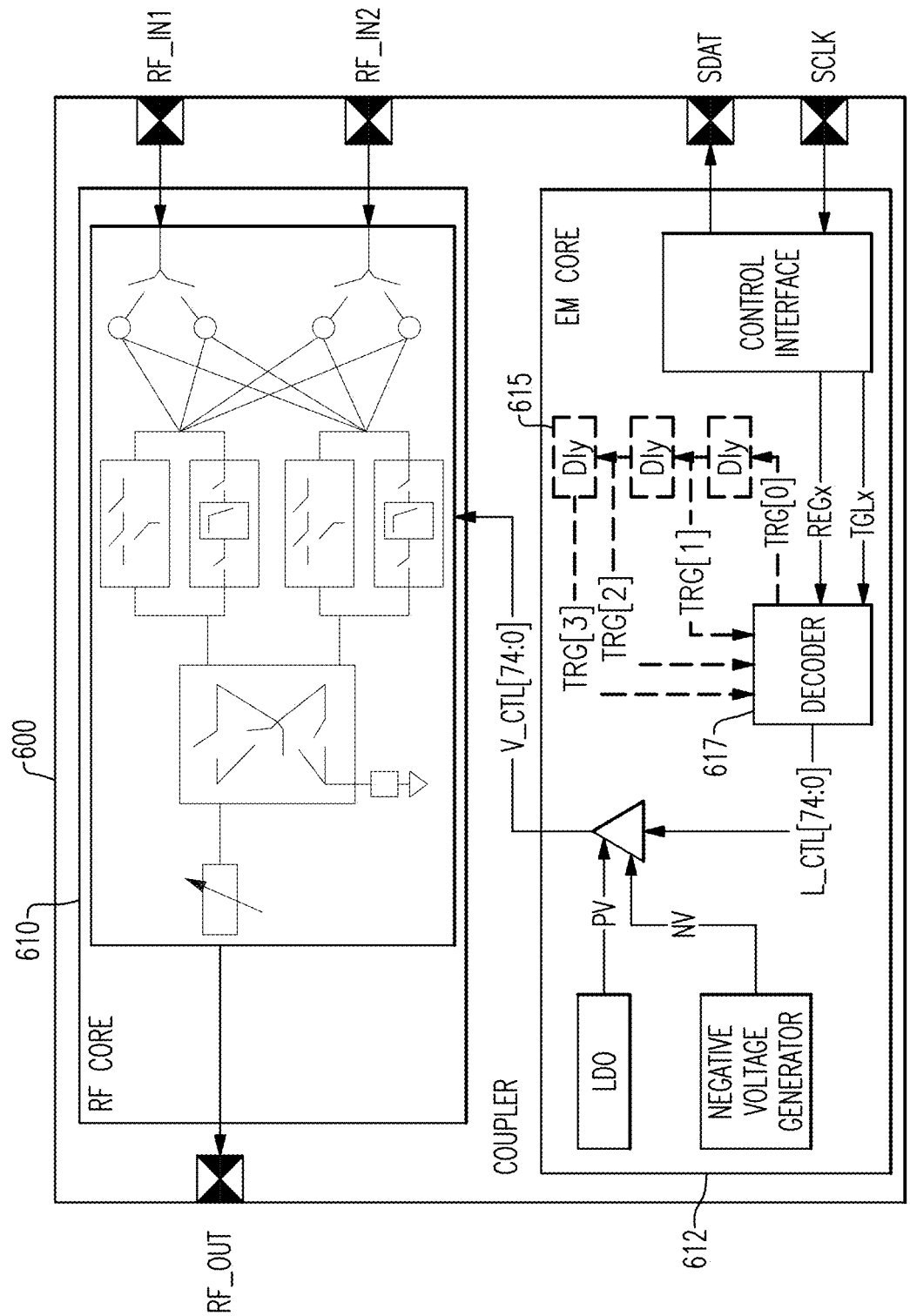
FIG. 6 is a block diagram of an enhanced decoder of an exemplary antenna switch module.
Figure 7:
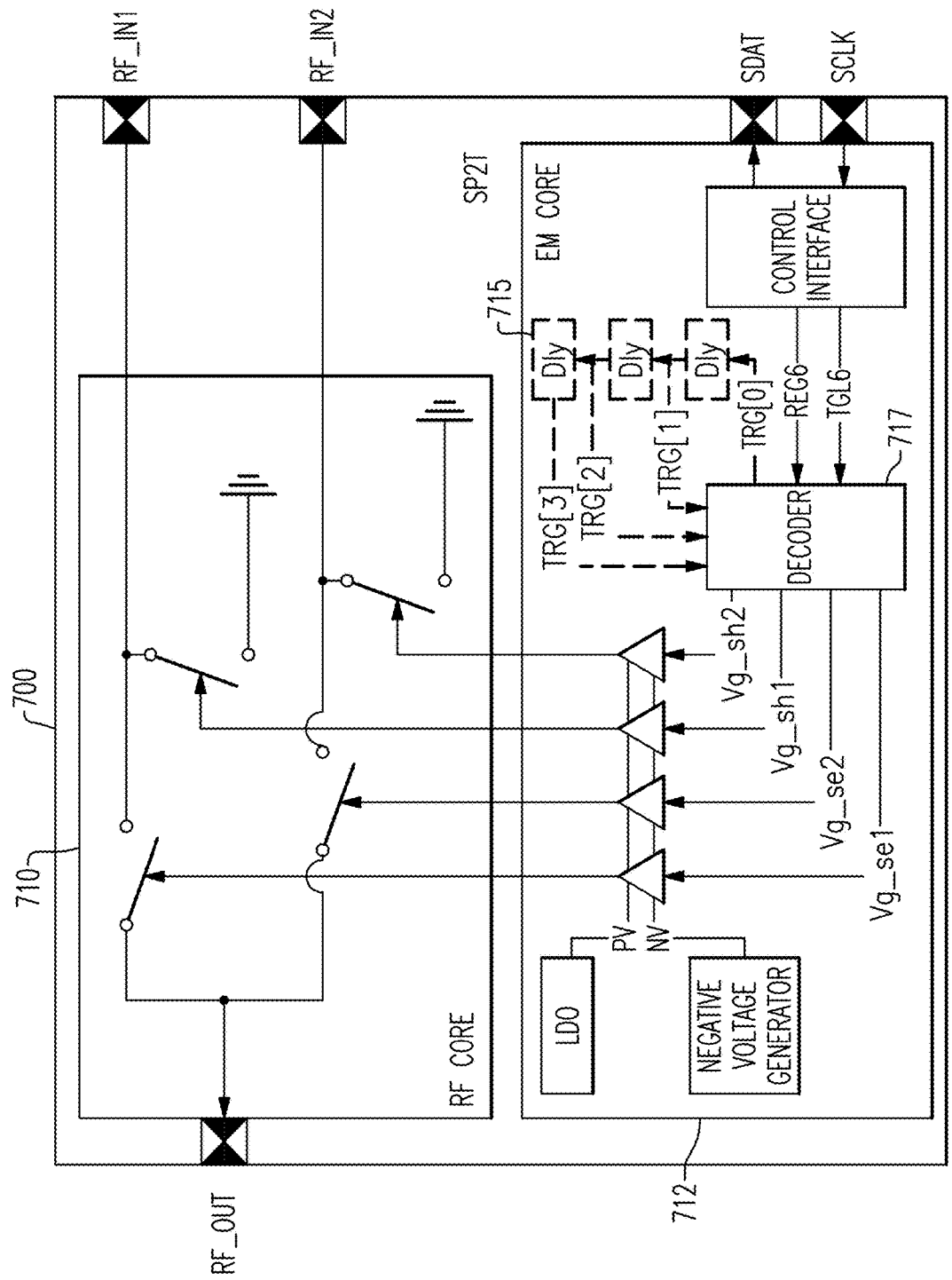
FIG. 7 is a block diagram of an enhanced decoder of an exemplary antenna switch module.

FIG. 6 and FIG. 7 show block diagrams of a coupler or a SPDT of an ASM comprising aspects of the of decoder 517 shown in FIG. 5. The decoder 617 (717) receive a toggle signal TGL_6 (TGL_x) and REG_6 (REG_x) signal. The transition detector FSM gets activated when the toggle signal TGL_6 (TGL_x) and REG_6 (REG_x) signal received by the decoder 617 (717) matches a valid state transition, which requires a dynamic sequence.

TABLE B

| | | Dynamic | | | |
|---|---|---|---|---|---|
| State | Reg6[3:0] | Vg_se1 | Vg_se2 | Vg_sh1 | Vg_sh2 |
| 0 | 3 | 2.4 | −2.4 | −2.4 | 2.4 |
| 0-1 | | 2.4 | −2.4 | −2.4 | −2.4 |
| 0-1 | | 2.4 | 2.4 | −2.4 | −2.4 |
| 0-1 | | −2.4 | 2.4 | −2.4 | −2.4 |
| 1 | 4 | −2.4 | 2.4 | 2.4 | −2.4 |

A high signal (e.g., approximately 2.4 V) holds a switch in an ON state, whereas a low signal (e.g., approximately −2.4 V) holds a switch in an OFF state. As shown in the SP2T top-level block diagram (cf. FIG. 7 and Table B), the enhanced dynamic decoder uses a triple-delayed trigger signal bus, which is used internally to step the switch control signals in a dynamic sequence from one state to another. The trigger signal is generated internally based on specific pre-defined state transitions, which require a dynamic timing response.

Figure 8:
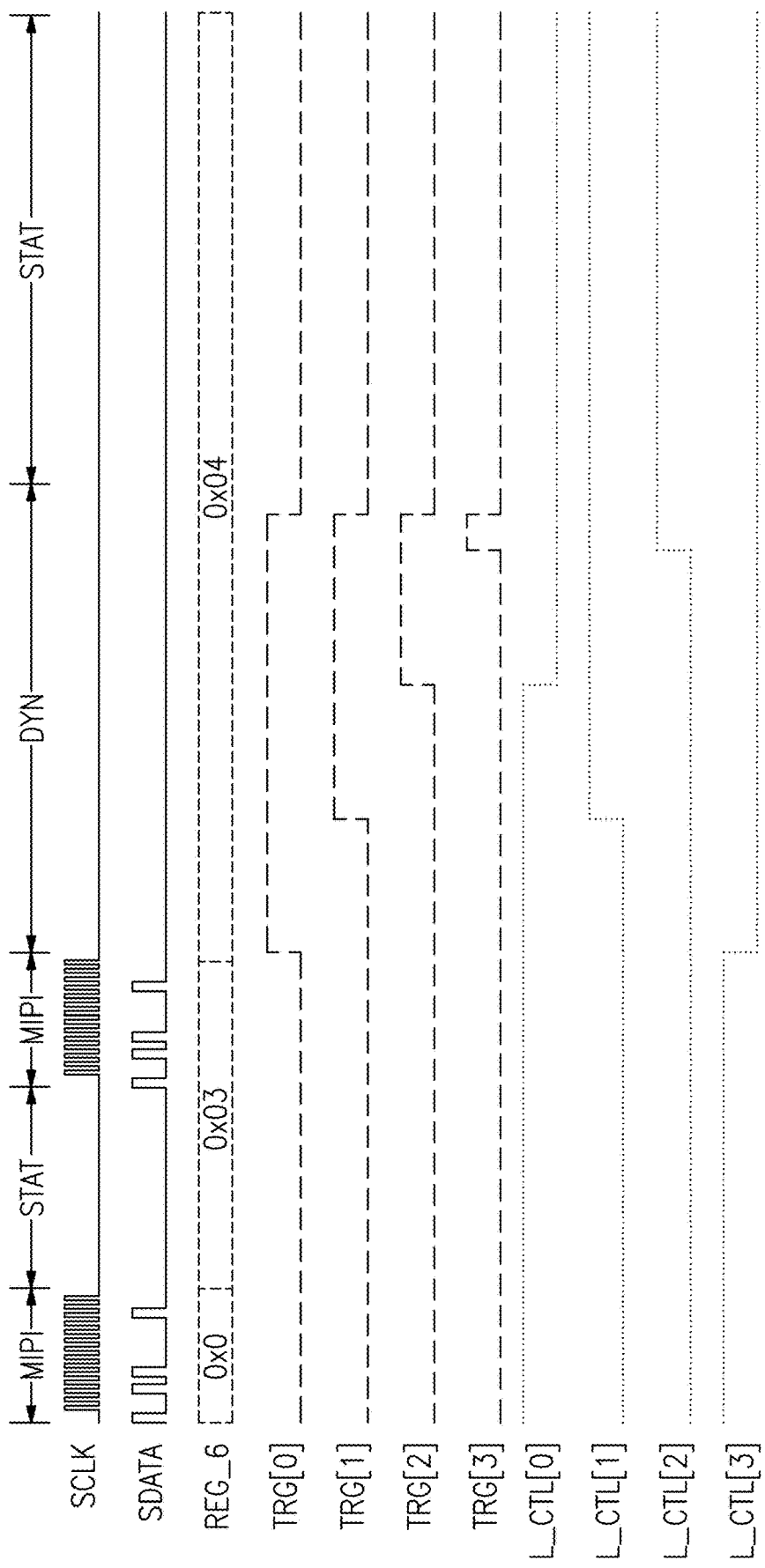
FIG. 8 is a diagram illustrating functionality of a dynamic decoder of e.g. the antenna switch module shown in FIG. 7.

FIG. 8 is a timing diagram illustrating the functionality of the dynamic decoder 517 of FIG. 7 according to one or more embodiments disclosed herein. The illustrated periods correspond to new register programming (MIPI), static transition with dynamic transition inactive (STAT), and dynamic state insertion (DYN). The propagation time of each delay (cf. Dly in FIG. 7) block controls the transition of the sequential signals TRG{1}, TRG[2] and TRG[3]. The entire DYN section is equivalent to three times the propagation delay of the delay block. There is a trade-off to define the duration of the dynamic delay section (cf. DYN in FIG. 8), as it needs to be long enough to suppress spurious tones, which can be up to 250 ns, but also cannot be too long, in order not to violate switching time requirements. 500 ns is an example for the duration of the dynamic delay section DYN.

This solution eliminates a set of high-amplitude spurious tones during hot-switching, by separating the individual shunt and series switch control functions into separate time-controlled events, which tremendously reduces the compounded effect, that all switches have on the impulse response and therefore pushes the level of any spurious tone below the noise floor.

The same concept can be easily applied to any antenna switch front-end module or couple and address any concerns of hot-switching spurious tones (such as the coupler module shown in FIG. 6) with the same enhanced improvements, enabling a dynamic switch control transition, based on a triple-step decoder sequence (cf three additional steps rows 2-4 in Table B, where Table A has only two steps).

The original decoder only consists of one main combinatorial look up table (LUT), which maps a set of register values, defining band selection and other modes, to a series of RF core control signals. The innovation enhances the decoders 317 and 417 shown in FIGS. 3 and 4 with the following dynamic modules illustrated decoder 517 of FIG. 5:

Transition Detector: It continuously observes all transitions from the registers in question (reg_5, reg6). If the transition matches with any of the ones specified, which require an intermediate state, the detector state-machine activates the transition controller and defines an index for the intermediate state as well as enables the transition selection multiplexor and a trigger signal, controlling the dynamic transition event. A synchronized register toggle control signal from the digital control interface is used to accurately detect the state transition between current and new register settings and avoid any meta-stability issues.

Transition Delay: The transition trigger TRG[0] is delayed in three individual segments TRG[1], TRG[2], and TRG[3] externally to the decoder 517, in order for the decoder 517 to generate the dynamic triple-step response. As soon as the third delay signal is received, the transition detector controller is put back to idle state and dynamic transition is completed, until a new detection occurs.

Dynamic LUT: The Dynamic LUT 519 generates the intermediate state, based on the transition index IDX_TRN, defined by the transition detector 513.

Transition Multiplexor: The transition multiplexor MUX passes the output of the dynamic LUT 519 to the decoder output during the transition period, instead of the output of the main LUT.

Comparing simulation results of an original state coupler against an enhanced dynamic decoder shows a significant reduction of transient spurious tone levels during a hot-switching by 20 dB.

Figure 9B:
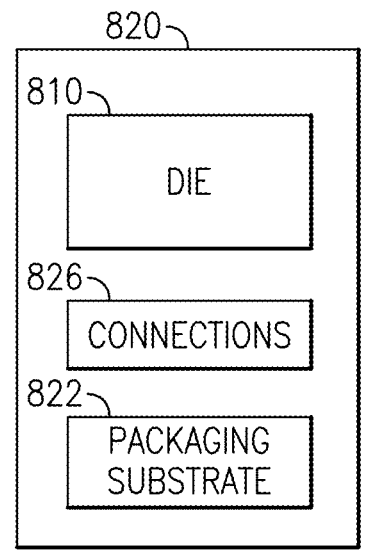
FIG. 9B is a block diagram representing a die according to one or more embodiments.
Figure 9A:
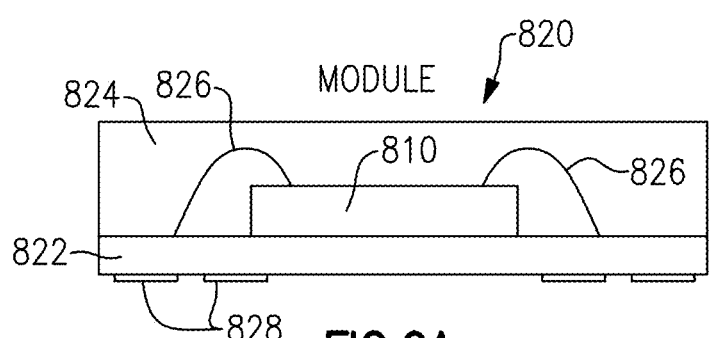
FIG. 9A illustrates a die according to one or more embodiments.

In some embodiments, a die having one or more features as described herein can be implemented in a module. FIG. 9A shows an example of such a module 920, and FIG. 9B shows a block diagram representation of the same. The module 920 can include a die 910, which may be mounted on a packaging substrate 922, and can be protected by an overmold structure. Electrical connections to and from the die 910 can be facilitated by connections 926 such as wirebonds. Such wirebonds can be interconnected to connection pads 928 formed on the module so as to facilitate connectivity to other modules and/or external components.

In some embodiments, the module 920 can also include one or more surface-mount devices (SMD) mounted on the packaging substrate 922 and configured to facilitate and/or complement the functionality of the integrated circuits in the die 910. In some embodiments, the module 920 can also include one or more packaging structures to, for example, provide protection and facilitate easier handling of the module 920. Such a packaging structure can include an overmold formed over the packaging substrate 922 and dimensioned to substantially encapsulate the various circuits and components thereon. It will be understood that although the module 920 is described in the context of wirebond-based electrical connections, one or more features of the present disclosure can also be implemented in other packaging configurations, including flip-chip configurations.

Figure 10:
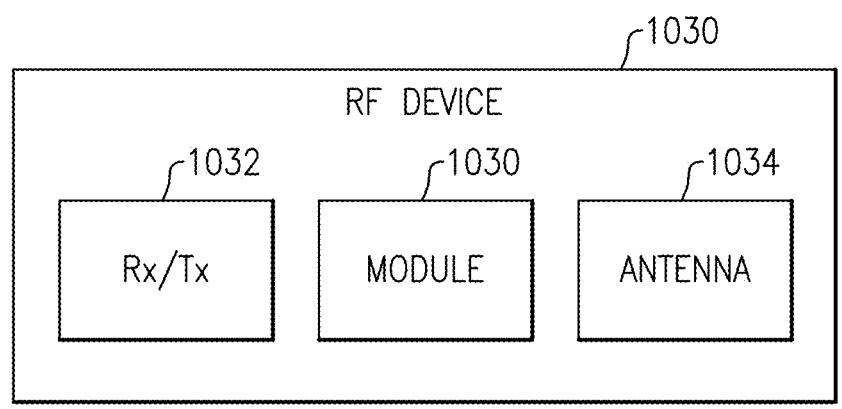
FIG. 10 is a block diagram representing a radio-frequency device according to one or more embodiments.

In some embodiments, a module or a die having one or more metal gate structures as described herein can be implemented in a RF device. FIG. 10 shows an example of such an RF device 1030. The RF device 1030 can include a module 1020 similar to the module described in reference to FIGS. 9A and 9B. In some implementations, such a module can facilitate operation of a transmit/receive circuit 1032 and an antenna 1034. In some embodiments, the module 1020 can be configured to provide, for example, amplification of RF signals, switching of RF signals, and/or other RF related functions.

Wireless Communication Devices

In some implementations, a device and/or a circuit having one or more features described herein can be included in a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 11:
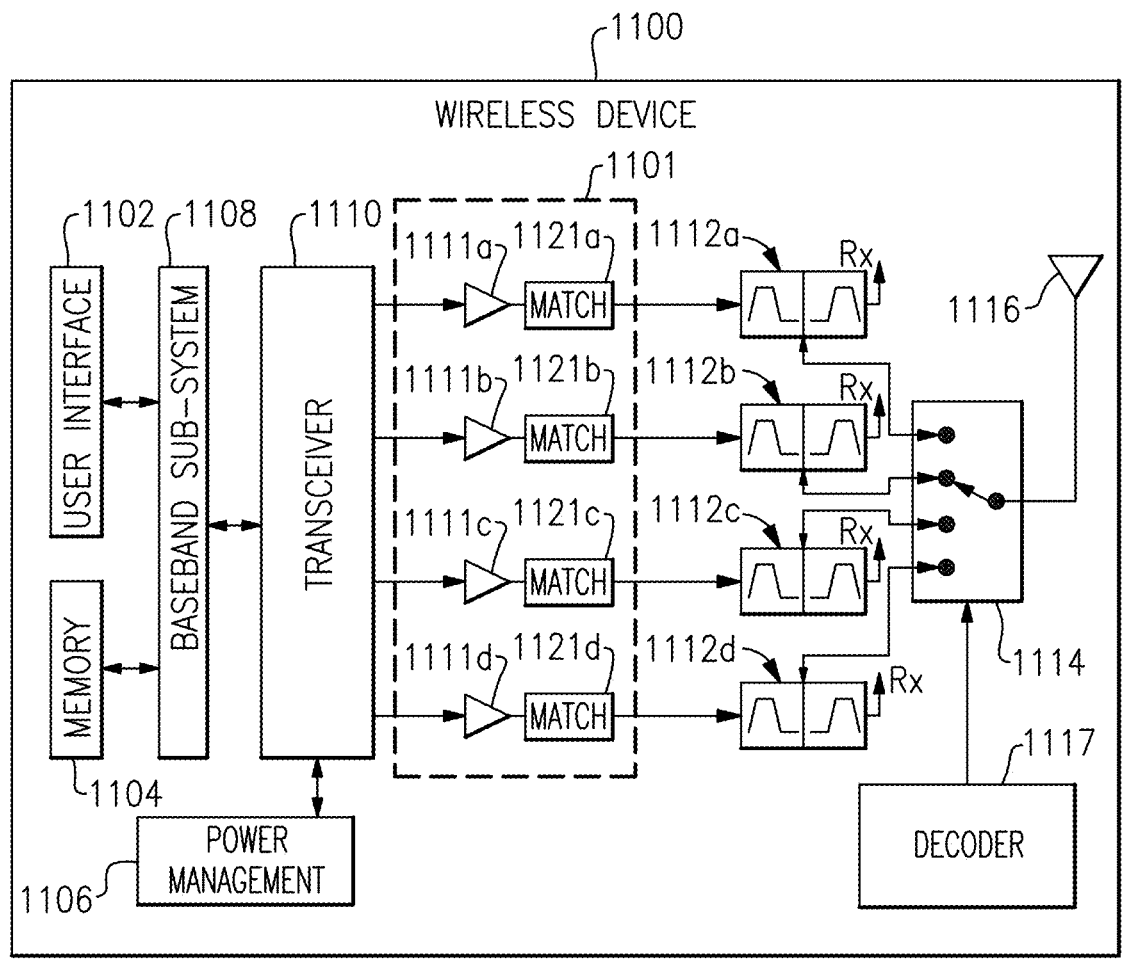
FIG. 11 is a block diagram representing a wireless device according to one or more embodiments.

FIG. 11 schematically depicts an example wireless device 1100 having one or more advantageous features described herein. One or more power amplifiers (PA) are shown, which may facilitate, for example, multi-band operation of the wireless device 1100. In embodiments where the PAs and their matching circuits are packaged into a module, such a module can be represented by a dashed box 1101.

The PAs 1111 can receive their respective RF signals from a transceiver 1110 that can be configured and operated in known manners to generate RF signals to be amplified and transmitted, and to process received signals. The transceiver 1110 is shown to interact with a baseband sub-system 1108 that is configured to provide conversion between data and/or voice signals suitable for a user and RF signals suitable for the transceiver 1110. The transceiver 1110 is also shown to be connected to a power management component 1106 that is configured to manage power for the operation of the wireless device. Such power management can also control operations of the baseband sub-system 1108 and the module 1101.

The baseband sub-system 1108 is shown to be connected to a user interface 1102 to facilitate various input and output of voice and/or data provided to and received from the user. The baseband sub-system 1108 can also be connected to a memory 1104 that is configured to store data and/or instructions to facilitate the operation of the wireless device, and/or to provide storage of information for the user. In the example wireless device 1100, outputs of the PAs 1111 are shown to be matched (via match circuits 1121) and routed to an antenna 1116 via their respective duplexers 1112a-1112d and a band-selection switch 1114. The band-selection switch 1114 can include, for example, a single-pole-multiple-throw (e.g., SP4T) switch to allow selection of an operating band (e.g., Band 2).

In some embodiments, each duplexer 1112 can allow transmit and receive operations to be performed simultaneously using a common antenna (e.g., 1116). In FIG. 11, received signals are shown to be routed to "Rx" paths (not shown) that can include, for example, a low-noise amplifier (LNA). The switch 1114 may be associated with a decoder 1117 configured to provide control signals to at least partially control the operation of the switch 1114 and/or other component(s) to prevent ALL-OFF conditions as described herein.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. The components described above in connection with FIG. 11 and wireless device 1100 are provided as examples, and are non-limiting. Moreover, the various illustrated components may be combined into fewer components, or separated into additional components. For example, baseband sub-system 1108 can be at least partially combined with the transceiver 1110. As another example, the transceiver 1110 can be split into separate receiver and transmitter portions.

The wireless device 1100 may include one or more pseudomorphic high electron mobility transistors (pHEMT), metal semiconductor field effect transistors (MESFET), heterojunction bipolar transistors (HBT), bipolar FETs (BiFET), bipolar HEMTs (BiHEMT), and/or surface acoustic wave (SAW) devices (e.g., SAW filter or resonator) that can include or be connected to gate structures having one or more features as described herein. It will be understood that other semiconductor devices utilized in wireless devices can also benefit from such gate structures. It will also be understood that semiconductor devices associated with other types of electronic devices can also benefit from gate structures having one or more features as described herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

An acoustic wave filter including any suitable combination of features disclosed herein be arranged to filter a radio frequency signal in a 5G NR operating band within Frequency Range 1 (FR1). A filter arranged to filter a radio frequency signal in a 5G NR operating band can include two types of acoustic resonators in accordance with any principles and advantages disclosed herein. FR1 can be from 410 MHz to 7.125 GHz, for example, as specified in a current 5G NR specification. In 5G applications, an acoustic wave filter with a relatively wide pass band and relatively low insertion loss can be advantageous for implementing dual connectivity. An acoustic wave filter in accordance with any suitable principles and advantages disclosed herein can be arranged to filter a radio frequency signal in a 4G LTE operating band and/or in a filter having a passband that includes a 4G LTE operating band and a 5G NR operating band. Filters disclosed herein can filter radio frequency signals in a frequency range from about 400 MHz to 3 GHz in certain applications.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions, and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A radio-frequency module comprising:
a radio-frequency input port;
a radio-frequency output port;
a radio-frequency core connected between the radio-frequency input port and the radio-frequency output port and configured to transition between a plurality of operational states; and
an energy management core configured to trigger a selected transition between two operational states of the plurality of operational states via a sequence of transitions between the plurality of operational states.

2. The radio-frequency module of claim 1 wherein the plurality of operational states include initial states and final states of a plurality of switches.

3. The radio-frequency module of claim 2 wherein a state of at least one switch of the plurality of switches remains unchanged upon transitioning via the sequence of transitions between the plurality of operational states.

4. The radio-frequency module of claim 1 wherein the energy management core includes a decoder configured to delay a trigger to sequence the transition between two selected operational states.

5. The radio-frequency module of claim 1 wherein the energy management core includes a transition detector configured to observe transitions between operational states of the plurality of operational states.

6. The radio-frequency module of claim 5 wherein the transition detector is further configured to define a transition index for generating one or more intermediate states.

7. A method of transitioning between operational states of a radio-frequency module comprising:
receiving a trigger to transition from an initial operational state to a final operational state;
sequencing the transition into a sequence of transitions between the initial operational state and the final operational state; and
transitioning from the initial operational state to the final operational state via the sequence of transitions.

8. The method of claim 7 wherein the sequence of transitions includes the initial operational state, one or more intermediate states, and the final operational state.

9. The method of claim 8 wherein the initial operational state, the one or more intermediate states, and the final operational state include initial states and final states of a plurality of switches.

10. The method of claim 9 wherein a state of at least one switch of the plurality of switches remains unchanged upon transitioning via the sequence of transitions.

11. A mobile device comprising:
an radio-frequency input port;
an radio-frequency output port;
an radio-frequency core connected between the radio-frequency input port and the radio-frequency output port and configured to transition between a plurality of operational states; and
an energy management core configured to trigger a selected transition between two operational states of the plurality of operational states via a sequence of transitions between the plurality of operational states.

12. The mobile device of claim 11 wherein the transition between the plurality of operational states includes an initial operational state and a final operational state.

13. The mobile device of claim 12 wherein the sequence of transitions includes the initial operational state, one or more intermediate states, and the final operational state.

14. The mobile device of claim 13 wherein the initial operational state, the one or more intermediate states, and the final operational state include initial states and final states of a plurality of switches.

15. The mobile device of claim 14 wherein a state of at least one switch of the plurality of switches remains unchanged upon transitioning via the sequence of transitions between the plurality of operational states.

16. The mobile device of claim 13 wherein the one or more intermediate states consist of one, two, or three states.

17. The mobile device of claim 11 wherein the energy management core includes a decoder configured to delay a trigger to sequence the transition between two selected operational states.

18. The mobile device of claim 11 wherein the energy management core includes a transition detector configured to observe transitions between operational states of the plurality of operational states.

19. The mobile device of claim 18 wherein the transition detector is further configured to define a transition index for generating one or more intermediate states.

20. The mobile device of claim 11 wherein the radio-frequency input port, the radio-frequency output port, the radio-frequency core and the energy management core are integrated in an radio-frequency frontend system of the mobile device.

* * * * *